United States Patent
Gao et al.

(10) Patent No.: US 10,204,696 B2
(45) Date of Patent: Feb. 12, 2019

(54) SHIFT REGISTER UNIT, GATE DRIVE CIRCUIT HAVING THE SAME, AND DRIVING METHOD THEREOF

(71) Applicants: BOE TECHNOLOGY GROUP CO., LTD., Beijing (CN); BEIJING BOE DISPLAY TECHNOLOGY CO., LTD., Beijing (CN)

(72) Inventors: Yingqiang Gao, Beijing (CN); Xiaopeng Cui, Beijing (CN); Dongliang Wang, Beijing (CN); Xingliang Li, Beijing (CN); Ruirui Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 40 days.

(21) Appl. No.: 15/541,622

(22) PCT Filed: Nov. 8, 2016

(86) PCT No.: PCT/CN2016/105068
§ 371 (c)(1),
(2) Date: Jul. 5, 2017

(87) PCT Pub. No.: WO2017/219585
PCT Pub. Date: Dec. 28, 2017

(65) Prior Publication Data
US 2018/0204628 A1  Jul. 19, 2018

(30) Foreign Application Priority Data

Jun. 24, 2016 (CN) .......................... 2016 1 0474708

(51) Int. Cl.
*G11C 19/00* (2006.01)
*G11C 19/28* (2006.01)
(Continued)

(52) U.S. Cl.
CPC .......... *G11C 19/28* (2013.01); *G09G 3/2003* (2013.01); *G11C 19/184* (2013.01);
(Continued)

(58) Field of Classification Search
None
See application file for complete search history.

(56) References Cited

U.S. PATENT DOCUMENTS

2008/0219401 A1* 9/2008 Tobita .................. G09G 3/3677
377/79
2011/0058640 A1 3/2011 Shang et al.
(Continued)

FOREIGN PATENT DOCUMENTS

| CN | 102012591 A | 4/2011 |
|---|---|---|
| CN | 102956213 A | 3/2013 |

(Continued)

OTHER PUBLICATIONS

International Search Report & Written Opinion dated Mar. 24, 2017 regarding PCT/CN2016/105068.
(Continued)

*Primary Examiner* — Tuan T Lam
(74) *Attorney, Agent, or Firm* — Intellectual Valley Law, P.C.

(57) ABSTRACT

The present application discloses a shift register unit circuit including an input port for receiving an input signal, an output port for outputting a gate driving signal, a first clock input port for receiving a first clock signal, a second clock input port for receiving a second clock signal, a pull-up node, a first pull-down node, a second pull-down node, a (Continued)

pull-up control sub-circuit connected to the input port and the pull-up node, a pull-up sub-circuit connected to the first clock input port and the pull-up node, a pull-down control sub-circuit connected to the first clock input port, a pull-down sub-circuit connected to the first pull-down node and the second pull-down node, a reset sub-circuit receiving a reset signal to control the potential level at the second pull-down node, and an initialization sub-circuit configured to receive an enabling signal for pulling-down the potential level at the second pull-down node.

18 Claims, 14 Drawing Sheets

(51) Int. Cl.
 *G09G 3/20* (2006.01)
 *G11C 19/18* (2006.01)
 *G09G 3/36* (2006.01)
(52) U.S. Cl.
 CPC ... *G09G 3/3677* (2013.01); *G09G 2310/0286* (2013.01); *G09G 2310/061* (2013.01); *G09G 2320/0219* (2013.01)

(56) References Cited

U.S. PATENT DOCUMENTS

| 2012/0113088 A1* | 5/2012 | Han | G09G 3/3674 345/212 |
| 2012/0262438 A1* | 10/2012 | Shang | G11C 19/28 345/211 |
| 2014/0079173 A1* | 3/2014 | Yan | G11C 19/28 377/64 |
| 2014/0119493 A1* | 5/2014 | Yang | G11C 19/28 377/64 |
| 2014/0160000 A1* | 6/2014 | Ma | G11C 19/28 345/100 |
| 2014/0168044 A1* | 6/2014 | Hu | G09G 3/3696 345/90 |
| 2014/0240209 A1* | 8/2014 | Zhang | G09G 3/3648 345/92 |
| 2016/0253975 A1 | 9/2016 | Yang et al. | |
| 2016/0300542 A1 | 10/2016 | Zhang et al. | |
| 2017/0039968 A1 | 2/2017 | Chen et al. | |

FOREIGN PATENT DOCUMENTS

| CN | 103093825 A | 5/2013 |
| CN | 103426414 A | 12/2013 |
| CN | 104299594 A | 1/2015 |
| CN | 104732939 A | 6/2015 |
| CN | 205282053 U | 6/2016 |
| CN | 105895047 A | 8/2016 |
| JP | 11160671 A | 6/1999 |
| JP | 5719956 B2 | 5/2015 |

OTHER PUBLICATIONS

First Office Action in the Chinese Patent Application No. 201610474708.X, dated Nov. 30, 2017; English translation attached.

* cited by examiner

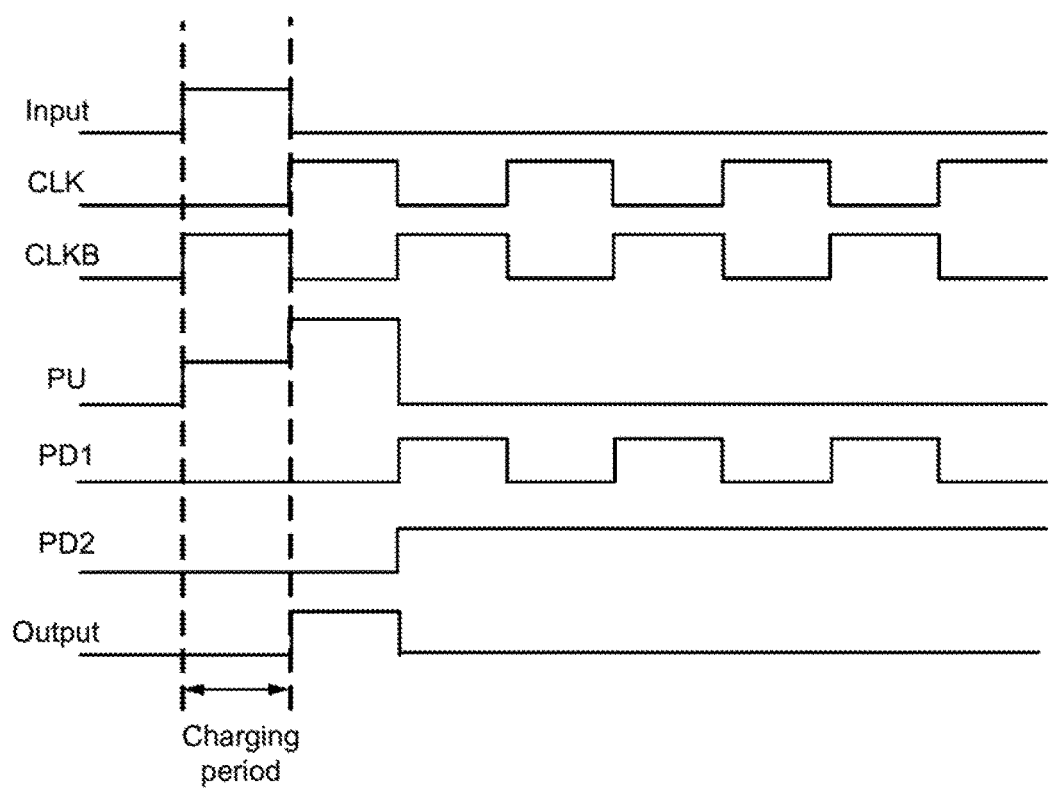

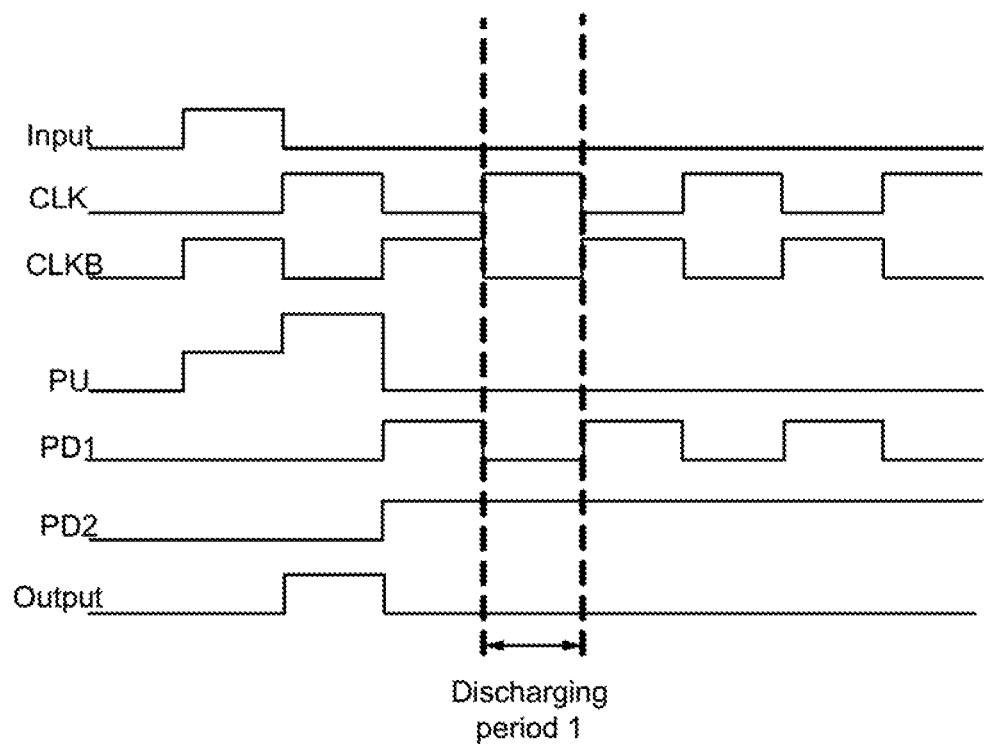

SHIFT REGISTER UNIT, GATE DRIVE CIRCUIT HAVING THE SAME, AND DRIVING METHOD THEREOF

CROSS-REFERENCE TO RELATED APPLICATION

This application is a national stage application under 35 U.S.C. § 371 of International Application No. PCT/CN2016/105068 filed Nov. 8, 2016, which claims priority to Chinese Patent Application No. 201610474708.X, filed Jun. 24, 2016, the contents of which are incorporated by reference in the entirety.

TECHNICAL FIELD

The present invention relates to a field of displaying, more particularly to a shift register unit and driving method, a gate drive circuit, and a display apparatus having the same.

BACKGROUND

Image display apparatuses include a driver for controlling image display in each of a plurality of pixels. The driver is a transistor-based circuit including a gate driving circuit and a data driving circuit. The gate driving circuit is primarily formed by cascading multiple units of shift register circuits. Each shift register unit outputs a gate driving signal to one of a plurality of gate lines of pixel transistors. The gate driving signals from the gate driving circuit scan through gate lines row by row, controlling each row of transistors to be in on/off states. The gate drive circuit can be integrated into a gate on array (GOA) circuit, which can be formed directly in the array substrate of the display panel.

SUMMARY

In one aspect, the present invention provides a shift register unit circuit comprising an input port for receiving an input signal, an output port for outputting a gate driving signal, a first clock input port for receiving a first clock signal, a second clock input port for receiving a second clock signal, a pull-up node, a first pull-down node, and a second pull-down node; the shift register unit circuit further comprising a pull-up control sub-circuit connected to the input port and the pull-up node, the pull-up control sub-circuit being configured to control a potential level at the pull-up node based on the input signal received from the input port; a pull-up sub-circuit connected to the first clock input port and the pull-up node, the pull-up sub-circuit being configured to output an output signal from the output port based on the first clock signal and the potential level at the pull-up node, the output signal being used as the gate driving signal; a pull-down control sub-circuit connected to the first clock input port, the second clock input port, and the pull-up node, the pull-down control sub-circuit being configured to control potential levels respectively at the first pull-down node and the second pull-down node based on the first clock signal, the second clock signal, and the potential level at the pull-up node; a pull-down sub-circuit connected to the first pull-down node and the second pull-down node, the pull-down sub-circuit being configured to pull down respective potential levels at the output port and the pull-up node based on the potential levels of the first pull-down node and the second pull-down node; a reset sub-circuit connected to a reset port for receiving a reset signal to control the potential level at the second pull-down node; and an initialization sub-circuit configured to receive an enabling signal for pulling-down the potential level at the second pull-down node to a potential level of a fixed low potential terminal; wherein the pull-down control sub-circuit is configured to maintain the potential levels of the first pull-down node and the second pull-down node at logic low if the potential level of the pull-up node is set to logic high.

Optionally, the reset sub-circuit includes a diode having an anode connected to the reset port and a cathode connected to the second pull-down node.

Optionally, the initialization sub-circuit includes a transistor having a gate receiving the enabling signal, a first terminal connected to the second pull-down node and a second terminal connected to the fixed low potential terminal.

Optionally, the first clock signal and the second clock signal are alternatively provided with a logic high potential and a logic low potential with a substantially same frequency and amplitude but in reversed phase.

Optionally, the pull-down control sub-circuit is configured, under a condition that the potential level of the pull-up node is set at logic high, to maintain the potential level of the second pull-down node at logic low whenever the first clock signal is provided with a logic low potential.

Optionally, the pull-down control sub-circuit is configured, under a condition that the potential level of the pull-up node is set at logic high, to maintain the potential level of the first pull-down node at logic low whenever the second clock signal is provided with a logic low potential.

Optionally, the pull-down control sub-circuit comprises a first transistor, a second transistor, a third transistor, and a fourth transistor; wherein the first transistor has a first terminal connected to the second clock input port and a second terminal connected to the pull-down node; wherein the second transistor has a first terminal and a control terminal commonly connected to the second clock input port and a second terminal connected to a control terminal of the first transistor; wherein the third transistor has a first terminal connected to the first pull-down node and a control terminal connected to the pull-up node; wherein the fourth transistor has a first terminal connected to the second terminal of the second transistor, a control terminal connected to the pull-up node.

Optionally, the pull-down control sub-circuit further comprising a fifth transistor and a diode, the fifth transistor having a first terminal connected to the first clock input port, a control terminal connected to the second terminal of the second transistor, the diode having an anode connected to a second terminal of the fifth transistor and a cathode connected to the second pull-down node.

Optionally, the pull-down sub-circuit further comprising a sixth, transistor, a seventh transistor, an eighth transistor, and a ninth transistor; wherein the sixth transistor has a gate connected to the second pull-down node and a drain connected to the pull-up node; wherein the seventh transistor has a gate connected to the second pull-down node and a drain connected to the output port; wherein the eighth transistor has a gate connected to the first pull-down node and a drain connected to the pull-up node; wherein the ninth transistor has a gate connected to the first pull-down node and a drain connected to the output port.

Optionally, the logic high potential corresponds to a voltage signal that is applied to a gate of any transistor described herein for turning the transistor in a conduction state, the logic low potential corresponds to a voltage signal that is applied to a gate of any transistor described herein for turning the transistor in a blocking-state.

In another aspect, the present invention provides a gate drive circuit comprising N numbers of shift register units described herein cascaded in series from a first shift register unit to a N-th shift register unit, N being a natural integer greater than 1, wherein an n-th shift register unit, except the first shift register unit, is configured to have an input port connected to an output port of a previous adjacent (n−1)-th shift register unit, n being a natural integer and 1<n≤N; wherein the first shift register unit has an input port connected to an initialization receiving an enabling signal.

In another aspect, the present invention provides a display apparatus comprising a display panel, a data drive circuit, and a gate drive circuit described herein configured to output a plurality of gate drive signals to control a plurality of rows of transistors associated with an array of pixels disposed on the display panel for displaying image based on respective a plurality of image data provided by the data drive circuit.

In another aspect, the present invention provides a method for driving the shift register unit circuit, wherein the shift register unit comprises a pull-up control sub-circuit connected to an input port and a pull-up node; a pull-up sub-circuit connected to a first clock input port and the pull-up node for controlling an output port to output an output signal; a pull-down control sub-circuit connected to a first clock input port, a second clock input port, and the pull-up node; a pull-down sub-circuit connected to a first pull-down node and a second pull-down node; a pull-down sub-circuit connected to a first pull-down node and a second pull-down node; a reset sub-circuit connected to a reset port and the second pull-down node; and an initialization sub-circuit connected to an initialization port and the second pull-down node and a low potential level terminal; the method comprising controlling a potential level of the pull-up node via the pull-up control sub-circuit based on an input signal received at the input port; outputting an output signal from the output port controlled by the pull-up sub-circuit based on a first clock signal provided at the first clock input port and the potential level of the pull-up node; controlling potential levels of the first pull-down node and the second pull-down node via the pull-down control sub-circuit based on the first clock signal, a second clock signal provided at the second clock input port, and the potential level of the pull-up node; pulling down potential levels of the output port and the pull-up node controlled by the pull-down sub-circuit based on the potential level of the first pull-down node and/or the potential level of the second pull-down node; wherein controlling potential levels of the first pull-down node and the second pull-down node comprises maintaining, the potential level of the first pull-down node or the second pull-down node to be logic high when, the potential level of the pull-up node is at logic low.

Optionally, the method further comprises controlling a potential level of the second pull-down node to logic high based on a reset signal received at the reset port by the reset sub-circuit via a diode.

Optionally, the method further comprises pulling down the potential level of the second pull-down node to logic low based on an enabling signal at logic high received from the initialization port connected to the initialization sub-circuit through a gate of a transistor, the transistor having a source connected to the second pull-down node and a drain connected to a fixed low potential terminal.

Optionally, the first clock signal and the second clock signal are alternatively provided with a logic high potential and a logic low potential with a substantially same frequency and amplitude but in reversed phase.

Optionally, controlling potential levels of the first pull-down node and the second pull-down node comprises, under a condition that the potential level of the pull-up node is set at logic high, maintaining the potential level of the second pull-down node at logic low whenever the first clock signal is provided with a logic low potential.

Optionally, controlling potential levels of the first pull-down node and the second pull-down node comprises, under a condition that the potential level of the pull-up node is set at logic high, maintaining the potential level of the first pull-down node at logic low whenever the second clock signal is provided with a logic low potential.

BRIEF DESCRIPTION OF THE FIGURES

The following drawings are merely examples for illustrative purposes according to various disclosed embodiments and are not intended to limit the scope of the present invention.

FIGS. 3A and 3B show an operation state of the shift register unit during a charging period within one display cycle according to some embodiments.

FIGS. 6A and 6B show an operation state of the shift register unit during a first discharge maintaining period within one display cycle according to some embodiments.

DETAILED DESCRIPTION

Figure 1:
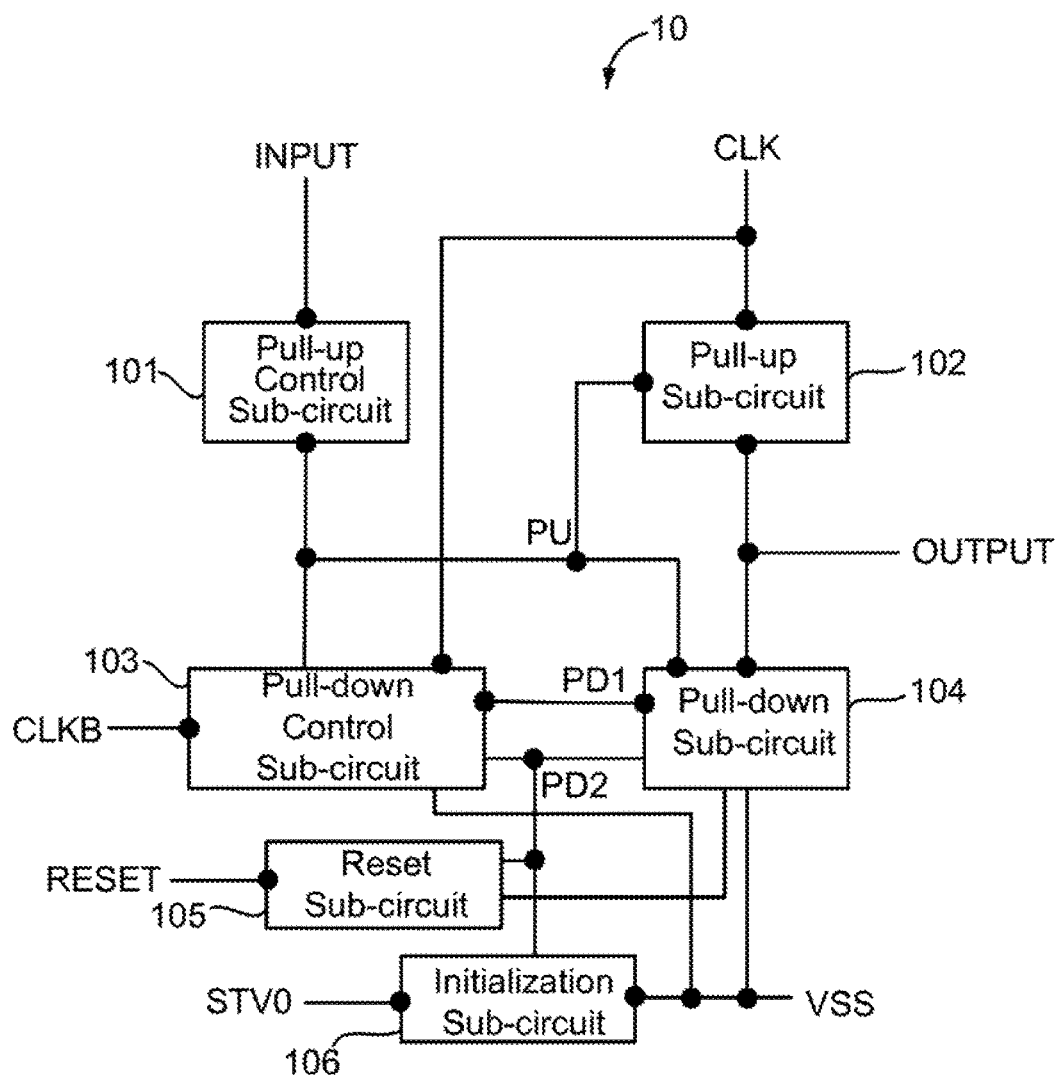
FIG. 1 is a functional diagram of a shift register unit according to some embodiments.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The GOA-based gate drive circuit includes a plurality of shift register units respectively connecting a plurality of gate lines arranged in rows. Each gate line receives a gate driving signal from a corresponding shift register unit, which is used to control on/off-state of thin-film transistors in a corresponding row of the array of image pixels. For example, one of shift register units outputs a gate driving signal with a first (high) potential level to make the corresponding row of thin-film transistors in on-stage so as to provide pixel brightness control based on data signals outputted from a data drive circuit. In another example, when a shift register unit outputs a gate driving signal with a second (low)

potential level to the corresponding gate line, all thin-film transistors sharing the gate line wilt be set to off-state so that no light comes out from the corresponding row of pixels.

However, noise exists in the gate driving signal outputted from the shift register unit. The noise level in the gate driving signal in a gate line may be high enough to cause corresponding row of thin-film transistors to be falsely turned on when these transistors are supposed to be in off-state, resulting in light leakage, image strobe or blur problems in the display apparatus.

Accordingly, the present invention provides, inter alia, a shift register unit and driving method, a gate drive circuit, and a display apparatus having the same that substantially obviate one or more of the problems due to limitations and disadvantages of the related art. In one aspect, the present disclosure provides a shift register unit including an input port for receiving an input signal, an output port for outputting a gate driving signal, a first clock input port for receiving a first clock signal, a second clock input port for receiving a second clock signal, a pull-up node, a first pull-down node, and a second pull-down node. In some embodiments, the shift register unit circuit further includes a pull-up control sub-circuit connected to the input port and the pull-up node, the pull-up control sub-circuit being configured to control a potential level at the pull-up node based on the input signal received from the input port; a pull-up sub-circuit connected to the first clock, input port and the pull-up node, the pull-up sub-circuit being configured to output an output signal from the output port based on the first clock signal and the potential level at the pull-up node, the output signal being used as the gate driving signal; a pull-down control sub-circuit connected to the first clock input port, the second clock input port, and the pull-up node, the pull-down control sub-circuit being configured to control potential levels respectively at the first pull-down node and the second pull-down node based on the first clock signal, the second clock signal, and the potential level at the pull-up node; a pull-down sub-circuit connected to the first pull-down node and the second pull-down node, the pull-down sub-circuit being configured to pull down respective potential levels at the output port and the pull-up node based on the potential levels of the first pull-down node and the second pull-down node. The pull-down control sub-circuit is configured to maintain the potential levels of the first pull-down node and the second pull-down node at logic low if the potential level of the pull-up node is set to logic high.

Figure 2:
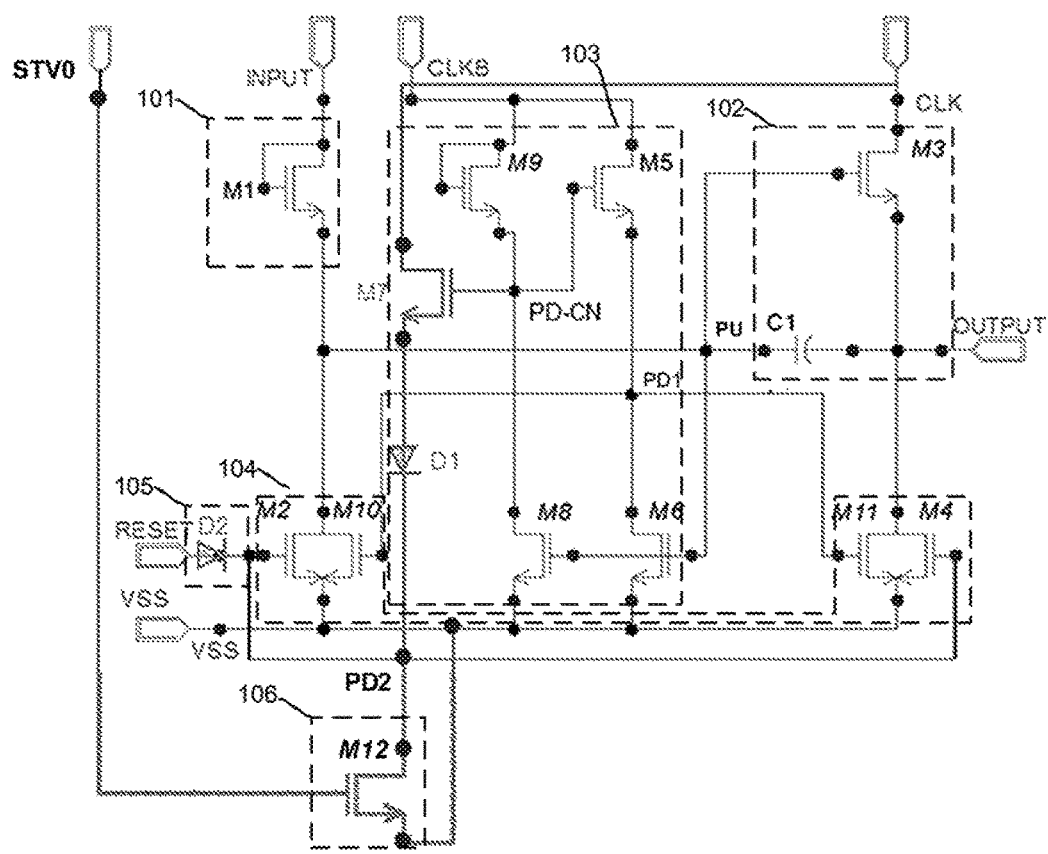
FIG. 2 is a circuit diagram of a shill register unit in a specific embodiment.

A shift register unit is a digital circuit, each unit being a flip-flop featuring an output connected to an input of a next flip-flop and sharing one or more clock signals to generate a binary output signal based on the input signal and potential levels at several circuit nodes. FIG. 1 is a functional diagram of a shift register unit according to some embodiments. FIG. 2 is a circuit diagram of a shift register unit of FIG. 1 in a specific embodiment. Referring to FIG. 1, the shift register unit 10 includes at least an input port INPUT for receiving an input signal, an output port OUTPUT for outputting a gate driving signal for a display panel, a first clock input port CLK and a second clock input port CLKB for providing a pair of complementary clock signals with reversed phase, a pull-up node PU, a first pull-down node PD1 and a second pull-down node PD2. Optionally, other functional ports may be added, such as a reset port, an initialization port, or others for refined control function.

The shift register unit circuit 10 further includes at least a pull-up control sub-circuit 101, a pull-up sub-circuit 102, a pull-down control sub-circuit 103, a pull-down sub-circuit 104, a reset sub-circuit 105, and an initialization sub-circuit 106, selectively connected to some of the circuit nodes and ports mentioned above. FIG. 2 shows an example of implementing the circuit function with thin-film transistors and/or diode or capacitors. Specifically, N-type transistors are used to illustrate the present invention. Optionally, P-type transistors can be used. Although the signals associated with input, output, clock input ports need to be adjusted when the transistor type is changed, the functional principle of the currently invented shift register unit remains the same. Also, the thin-film transistor is made so that its drain and source are substantially symmetric in circuitry connection. In following specification, drain or source terminal of any transistor can be interchangeable or simply named as first terminal or second terminal without changing functional features of the circuit.

Referring to FIG. 1, the pull-up control sub circuit 101 is connected to the input port INPUT and the pull-up node PU and is configured to control a potential level of the pull-up node PU based on the input signal received at INPUT. For example, when the input signal received at INPUT is a logic high signal, the potential level of the pull-up node PU is set to logic high.

Referring to FIG. 2, the pull-up control sub-circuit 101 includes a transistor M1 having its drain and gate commonly connected to input port INPUT and its source connected to the pull-up node PU. When INPUT receives a logic high potential as an input signal, M1 is turned on or set into a conduction state. The input signal is directly passed to the pull-up node PU. When the input signal received at INPUT is a signal at logic low, the transistor M1 is turned off or set to a blocking state. Thus, the input signal cannot be passed from INPUT to the pull-up node PU.

Referring to FIG. 1, the pull-up sub-circuit 102 is connected to the first clock input port CLK, the pull-up node PU, and the output port OUTPUT, and is configured to output an output signal at OUTPUT based on a first clock signal provided at the first clock input port CLK and the potential level of the pull-up node PU. For example, when node PU potential level is set to logic high and the first clock signal at CLK is provided with a logic high potential, the output signal at OUTPUT will be a logic high potential signal.

Referring to FIG. 2, the pull-up sub-circuit 102 includes a transistor M3 and a capacitor C1. M3 has a drain connected to the first clock input port CLK, a gate connected to the pull-up node PU, a source connected to the output port OUTPUT. C1 has one terminal connected to the node PU and another terminal connected to the port OUTPUT. The functional details will be shown below using additional timing diagram and overall circuitry status during several operation periods of one display cycle.

Referring to FIG. 1 again, the pull-down control sub-circuit 103 is connected to the first clock input port CLK, the second clock input port CLKB, the pull-up node PU, and both the first pull-down node PD1 and the second pull-down node PD2. In an embodiment, the pull-down control sub-circuit is configured to control a potential level of the first pull-down node PD1 and a potential level of the second pull-down node PD2 based on the first clock signal, the second clock signal, as the potential level of the pull-up node PU. In a specific embodiment, referring to FIG. 2, the pull-down control sub-circuit 103 includes at least a transistor M5, a transistor M9, a transistor M6, and a transistor M8 as shown in FIG. 2. M5 has a drain connected to the second clock input port CLKB and a source connected to the first pull-down node PD1. The drain and gate of M9 are commonly connected to the port CLKB and the source of M9 is connected to the gate of M5. M6 has a drain connected to the first pull-down node PD1 and a gate connected to the pull-up node PU. The drain of M8 is connected to the source of M9. The gate of M8 is connected to the pull-up node PU.

Referring to FIG. 2, the gate of M5, the source of M9, and the drain of M8 are all connected to a node PD-CN. In an embodiment, M5 is referred as a first transistor of the pull-down control sub-circuit 103. M9 is referred as a second transistor. M6 is referred as a third transistor. M8 is referred as a fourth transistor. Both source nodes of M6 and M8 are commonly connected to a low potential level terminal VSS (which is used to set a fixed logic low potential). The detail description about operations of these transistors in the shift register unit 10 will be given below via a timing diagram and multiple operation states of the circuit in corresponding operational periods of each display cycle.

Additionally, referring to FIG. 2, the pull-down control sub-circuit 103 includes a fifth transistor M7 and a diode D1. Transistor M7 has a drain connected to the first clock input port CLK, a gate connected to the source of M9. The gate of M7 also is connected to the node PD-CN. Diode D1 has an anode connected to the source of M7 and a cathode connected to the second pull-down node PD2.

Referring to FIG. 1, the pull-down sub circuit 104 is connected to both the first pull-down node PD1 and the second pull-down node PD2, the pull-up node PU, and the output port OUTPUT. In an embodiment, the pull-down sub-circuit 104 is configured to pull down the potential levels of the output port OUTPUT and the pull-up node PU based on the potential levels of the first pull-down node PD1 and the second pull-down node PD2. As shown in FIG. 2, the pull-down sub circuit 104 includes transistors M2, M4, M10, and M11. M2 has a gate connected to the second pull-down node PD2, a drain connected to node PU. M4 has a gate connected to the second pull-down node PD2 and a drain connected to the output port OUTPUT. M10 has a gate connected to the first pull-down node PD1 and a drain connected to the node PU. M11 has a gate connected to the first pull-down node PD1 and a drain connected to the output port OUTPUT. Additionally, the source nodes of M2, M4, M10, and M11 are commonly connected to the low voltage power source VSS. In an embodiment, M2 is referred as a sixth transistor. M4 is referred as a seventh transistor. M10 is referred as an eighth transistor. M11 is referred as a ninth transistor. The detail description about operations of these transistors in the shift register unit 10 will be given below via a timing diagram and multiple operation states of the circuit in corresponding operational periods of an image display cycle.

Referring to FIG. 1, the reset sub-circuit 105 is connected to a reset port RESET for receiving a reset signal and connected to the pull-down circuit 104 as well as the second pull-down node PD2. The reset signal can be used by the pull-down sub-circuit 104 to control the potential level of the second pull-down node PD2. As shown in FIG. 2, the reset sub-circuit 105 includes a diode D2 having its anode connected to the reset port RESET and its cathode connected to the second pull-down node PD2.

Referring to FIG. 1 again, the initialization sub-circuit 106 is connected to an initialization port STV0 and connected to the low potential level terminal VSS as well as the second pull-down node PD2. The initialization sub-circuit 106 receives an enabling signal from the initialization port STV0 to control pulling down the potential level of the second pull-down node PD2.

An image display cycle represents a certain time period during an array of pixels of a display panel are provided with corresponding sets of image data to define grayscale brightness of various color sub-pixels of the array of pixels. The image data are provided from a data drive circuit via a plurality of data lines connected to the sources of pixel transistors. The gates of these pixel transistors are controlled by the gate driving signals to effectively allow the image data to be passed to photodiodes connected to the drains to induce corresponding color light emission. While the gate driving signals are delivered within a certain period of each display cycle via a plurality of gate lines connected to a gate drive circuit that is made by cascading a plurality of shift register units with each unit's output port being connected to one corresponding gate line. One display cycle includes sequential time periods including at least a buffer charging period (or simply charging period), a charging pull-up (or simply pull-up) period, a discharging pull-down (or simply pull-down) period, a first maintaining period, and a second maintaining period.

Figure 3A:
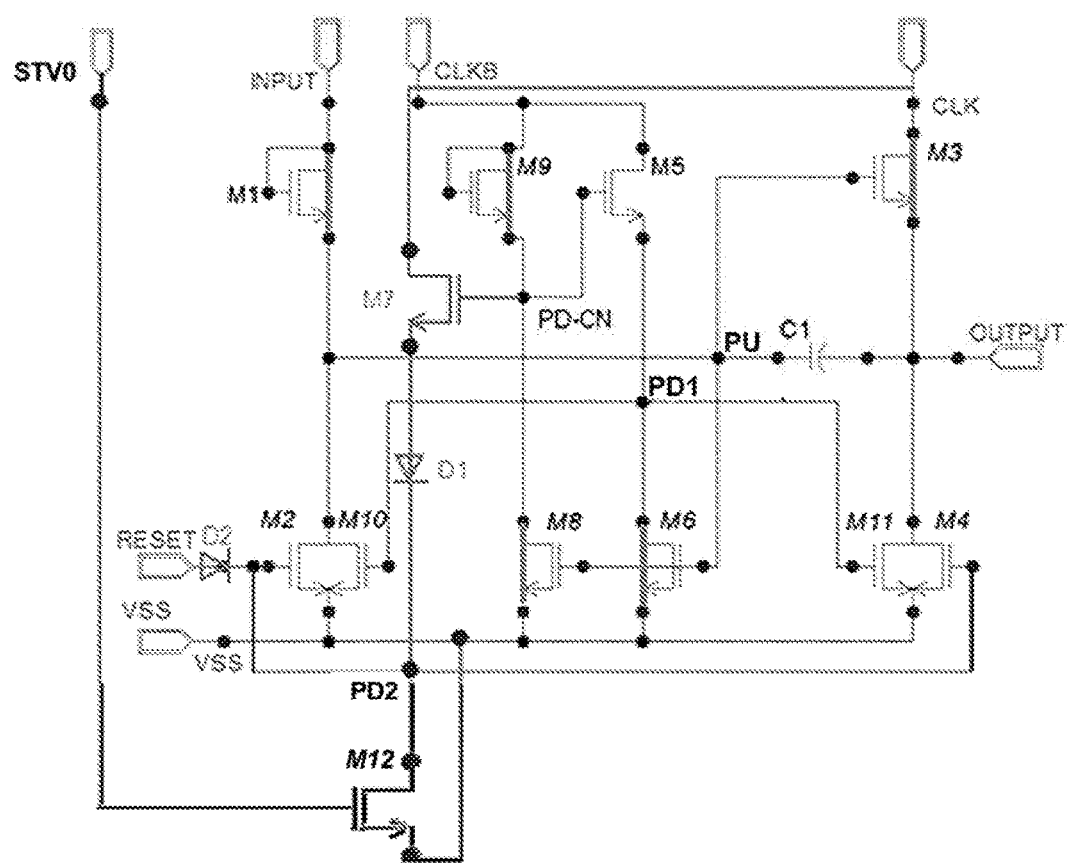

FIG. 3 shows an operation state of the shift register unit during a buffer charging period within one display cycle according to some embodiments. During the charging period, the input port INPUT receives a logic high potential. So, M1 is turned on to set the potential level of the pull-up node PU at logic high. As shown in part (B) of FIG. 3, the first clock input port CLK is provided with a logic low potential in this period and will be set to logic high potential in the subsequent period. The second clock signal is set to be a logic high potential in this period but will be set to logic low potential in the subsequent period, just be complimentary to the first clock signal with a reversed phase. Accordingly, M9 in this period is turned on.

Referring to the circuit operation state shown in FIG. 3 part (A), the pull-up node PU is set to logic high to charge the capacitor C1 in the pull-up sub-circuit 102 and M3 is turned on. But because the first clock signal is provided with a logic low potential, the output port OUTPUT only outputs an output signal at logic low potential.

Figure 4A:
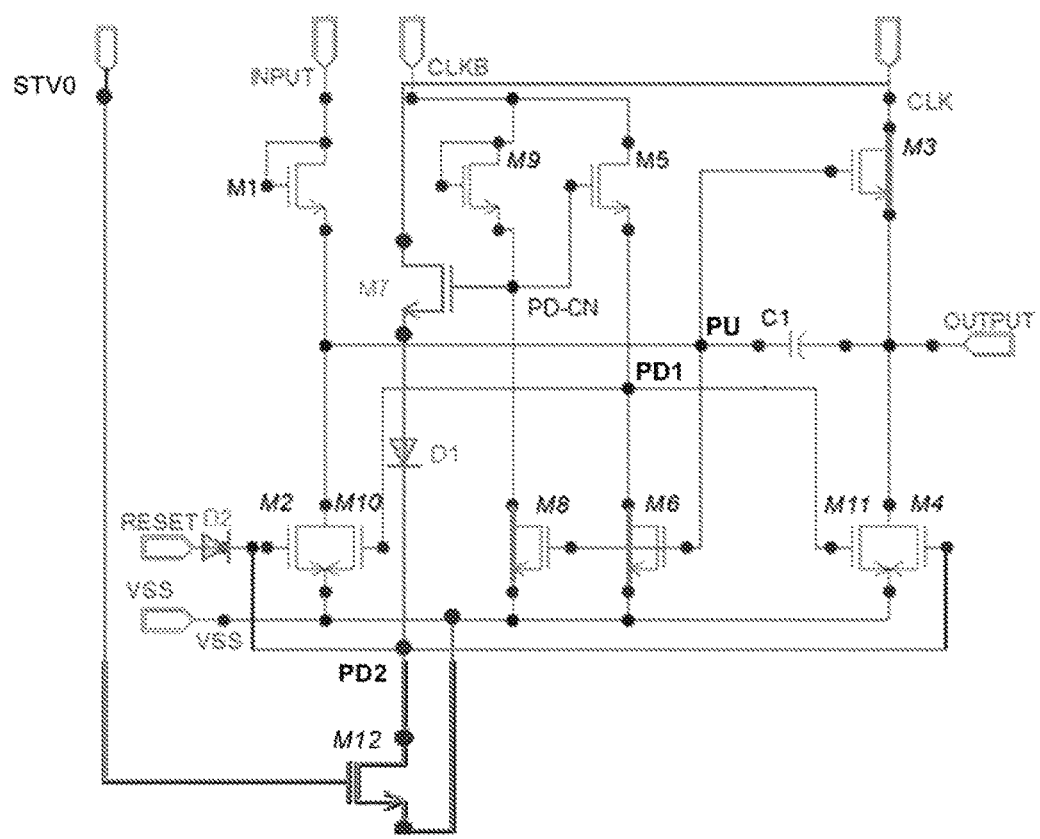
FIGS. 4A and 4B show an operation state of the shift register unit during a pull-up period within one display cycle according to some embodiments.
Figure 4B:
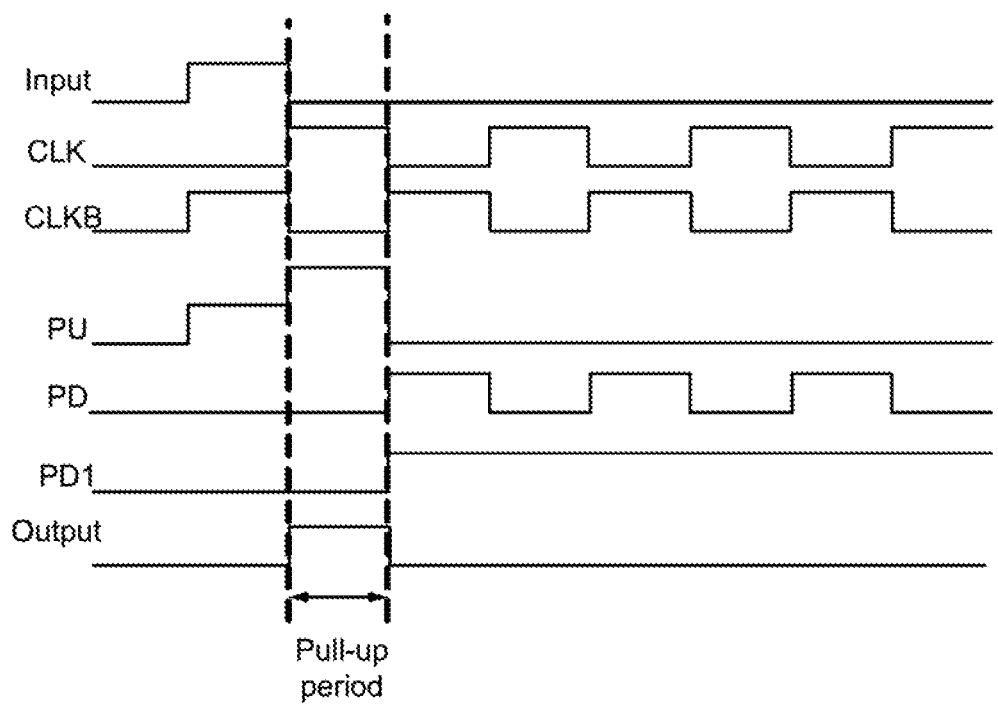

FIG. 4 shows an operation state of the shift register unit during a pull-up period within one display cycle according to some embodiments. Referring to part (B) of FIG. 4, during the pull-up period, the first clock signal is provided with a logic high potential at CLK and the input port INPUT provides a logic low potential as an input signal. Although the input signal will not cause M1 to be turned on, the charged capacitor C1 can push the potential level of the pull-up node PU higher to maintain at logic high potential due to a bootstrapping effect. Thus, M3 is still turned on in the pull-up period so that the output port OUTPUT is able to output the first clock signal, which is now at logic high potential, as an output signal at the logic high potential. This is logic high potential output signal is passed into the gate line and is able to control a row of pixel transistors that commonly share the gate line.

As shown in FIG. 3 and FIG. 4, outside the charging period and the pull-up period, the potential of the pull-up node PU is controlled to be at logic low to allow the output port OUTPUT to output only logic low potential. Also, outside the pull-up period, the output signal should be controlled to be at logic low. During these two periods, the first clock in CLK (which connects to the drain of transistor M3) is changing between logic low and logic high. Outside the charging period and the pull-up period, when the first clock signal is a logic high potential, the parasitic capacitance of transistor M3 may push the potential level at the pull-up node PU higher to turn M3 on. Therefore, the output port OUTPUT may still output a logic high potential signal (e.g., when the first clock signal is also a logic high potential) when the cycle time is outside the charging period and the pull-up period. In other words, the parasitic capacitance of M3 may induce noises in the pull-up node and output port OUTPUT, that result in light leakage, image strobe or blur or other image quality problems. The shift register unit introduced by the present disclosure is able to solve these problems by outputting the desired logic low potential signal shifted relative to the input signal under a control of the pull-up node potential level.

Referring to FIG. 3 and FIG. 4, during the charging period and the pull-up period, the pull-up node PU is set to a logic high potential to allow the output port OUTPUT to output a shifted output signal. Outside the above two periods, the pull-up node PU is set to a logic low potential. When the node PU is at logic low, in order to prevent the pull-up node PU and the output port OUTPUT from being affected by noise induced by M3 parasitic capacitance, the pull-down sub-circuit 104 is used to pull down potential levels of the pull-up node PU and the output port OUTPUT. In other words, when the potential level of the pull-up node PU is set to logic high, the pull-down control sub-circuit 103 is configured to control the potential levels of the first pull-down node PD1 or the second pull-down node PD2 at logic low. At the same time, the pull-down sub-circuit 104 is configured to pull down the potential levels of the output port OUTPUT and the pull-up node PU based on the logic low potential levels set for the first pull-down node PD1 and the second pull-down node PD2. Additional functional features of the pull-down control sub-circuit 103 and the pull-down sub-circuit 104 in rest periods of each image display cycle are given below via illustration of FIG. 5, FIG. 6, and FIG. 7.

Figure 5A:
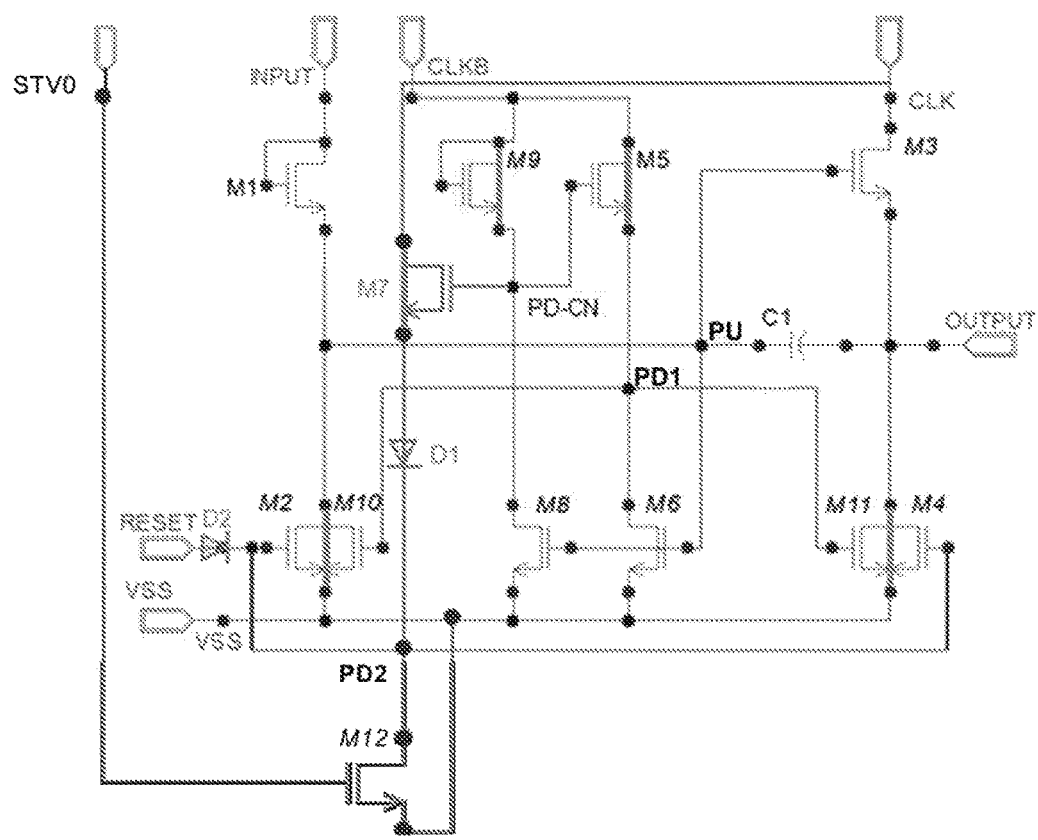
FIGS. 5A and 5B show an operation state of the shift register unit during a discharge pull-down period within one display cycle according to some embodiments.
Figure 5B:
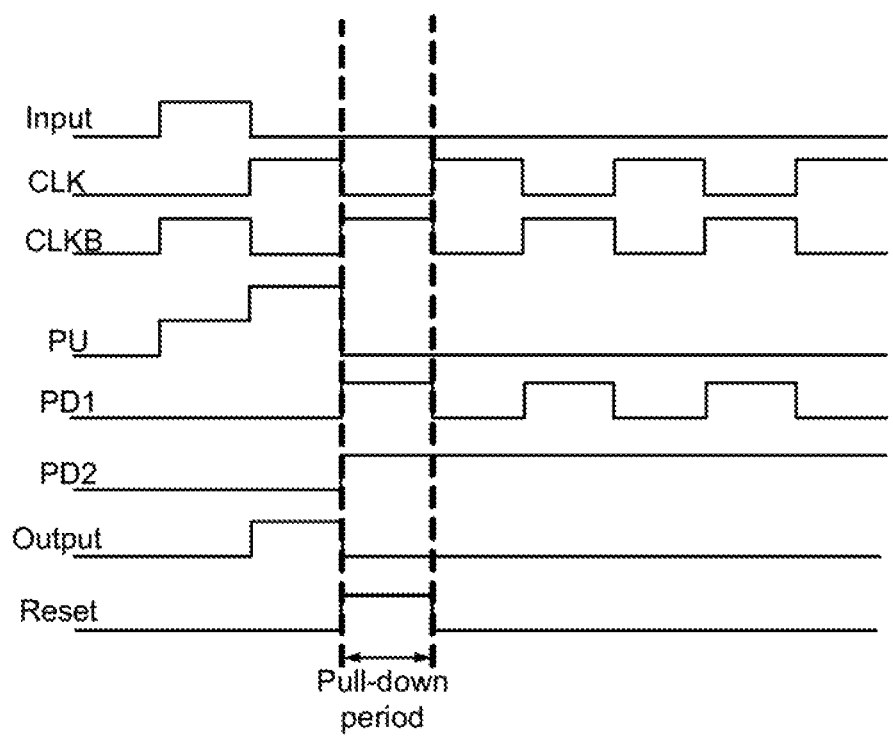
Figure 6A:
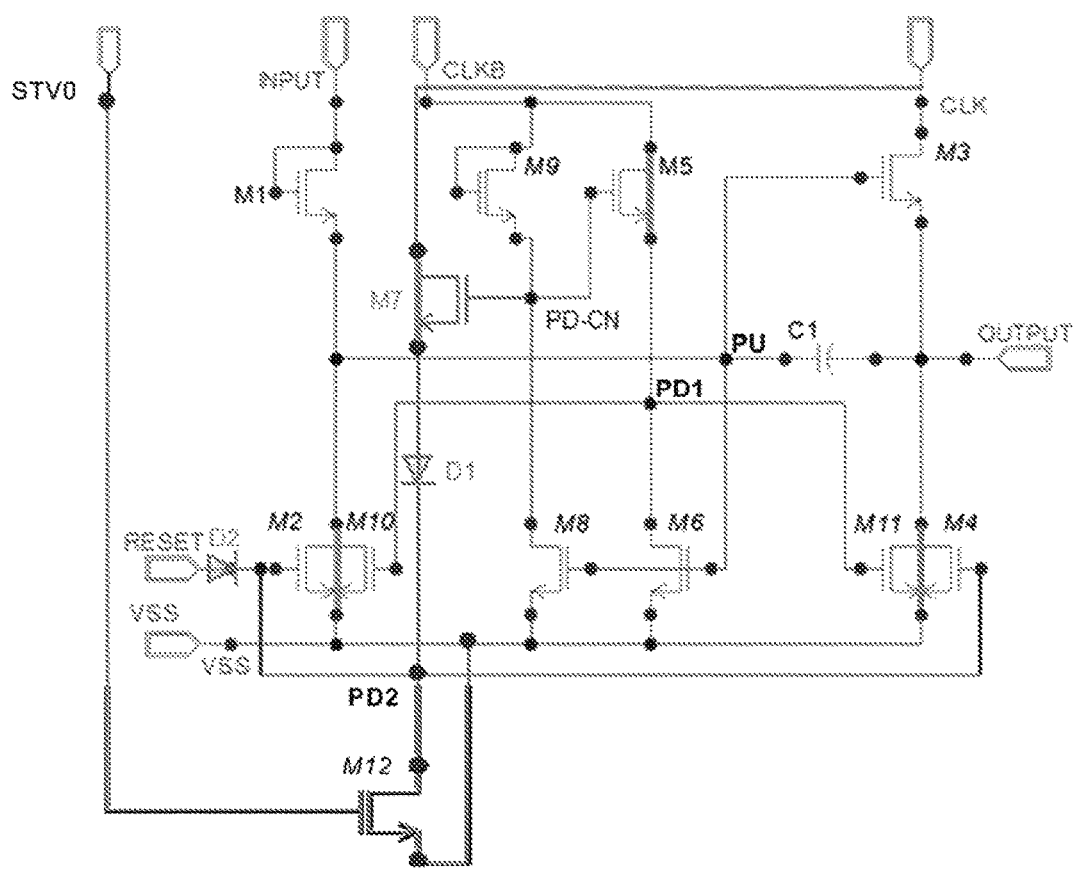
Figure 7A:
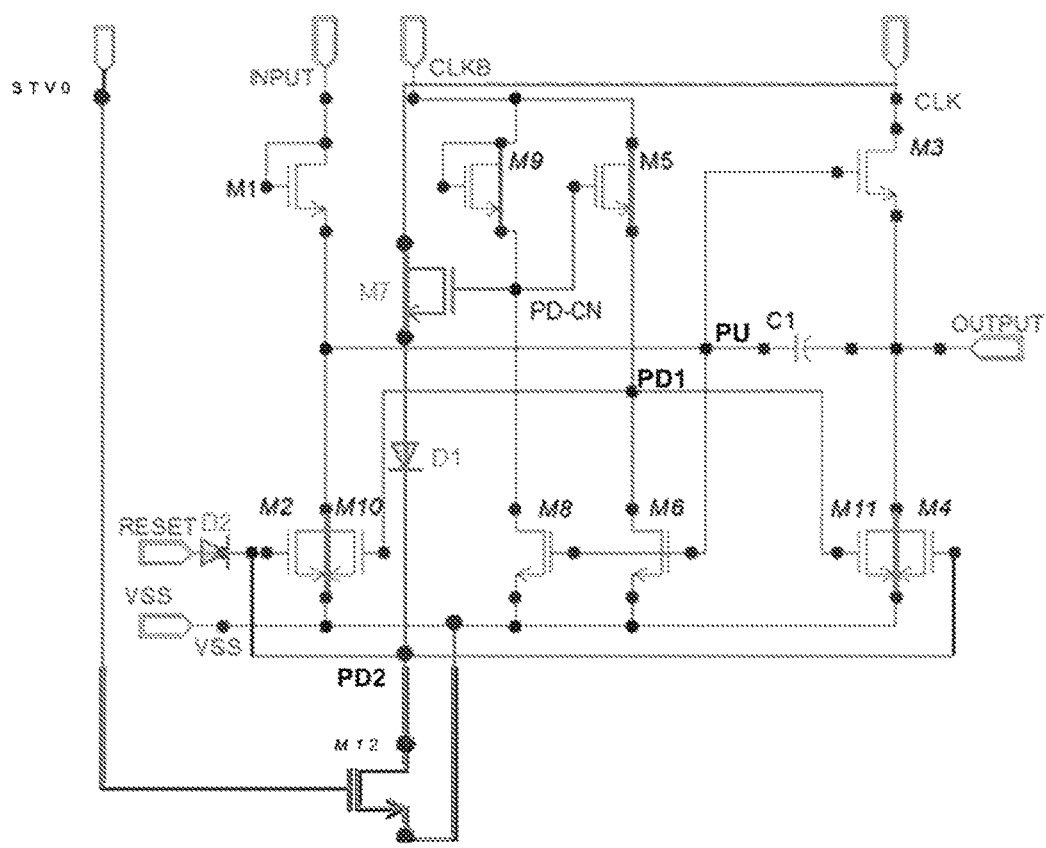
FIGS. 7A and 7B show an operation state of the shift register unit during a second discharge maintaining period within one display cycle according to some embodiments.
Figure 7B:
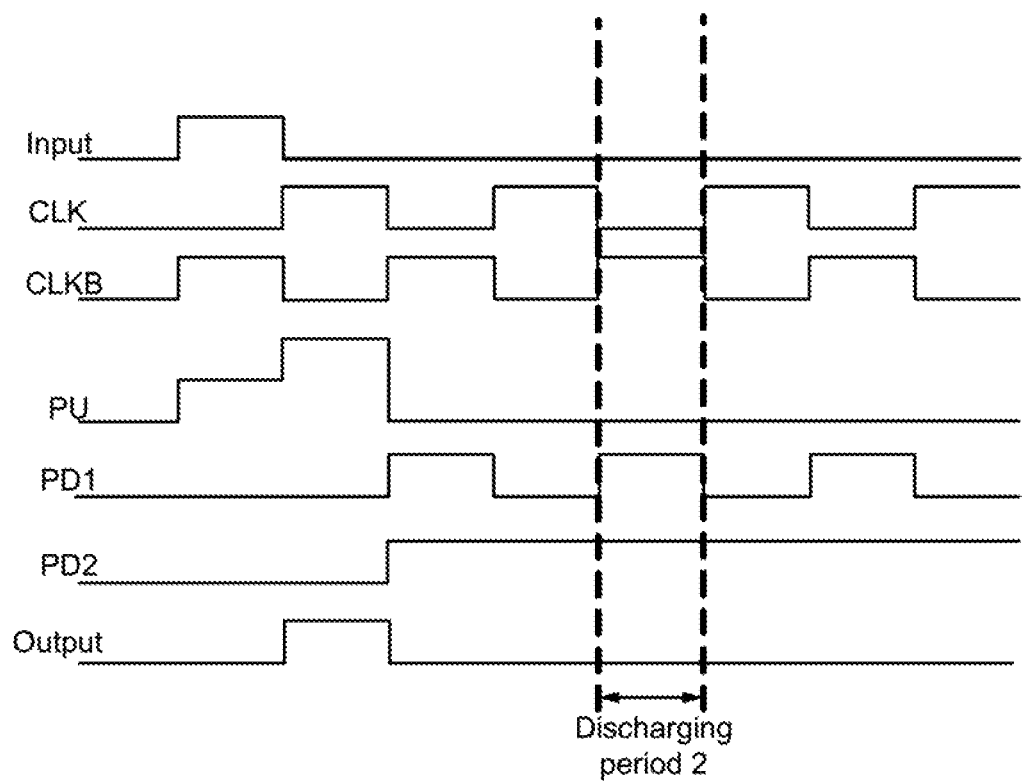

FIG. 5 shows an operation state of the shift register unit during a discharge pull-down period within one displays cycle according to some embodiments. FIG. 6 shows an operation state of the shift register unit during a first discharge maintaining period within one display cycle according to some embodiments. FIG. 7 shows an operation state of the shift register unit during a second discharge maintaining period within one display cycle according to some embodiments.

Referring to FIG. 5, in the discharging pull-down period, the second clock signal provided at the second clock input port CLKB is a logic high potential signal. As seen in part (A) of FIG. 5, transistors M5 and M9 are turned on. As the pull-up node PU is set to logic low in this period, transistors M6 and M8 are turned off to be in block-state. Thus, the first pull-down node PD1 is set to a logic high potential, further turning transistors M10 and M11 on to pull down potential levels of the output port OUTPUT and the pull-up node PU. Additionally, during the discharge pull-down period, since transistors M5 and M9 are in conduction state, the PD-CN node is also set to logic high potential. High potential at PD-CN makes transistor M7 in a conduction state.

Referring to FIG. 6, in the first discharge maintaining period, the second clock signal is at a logic low potential. But the high potential at the PD-CN node can turn transistors M5 and M7 on. When M7 is in a conduction state, the logic high potential of the first clock signal at port CLK can turn the diode D1 into a conductor, thereby setting the second pull-down node PD2 to a logic high potential. Additionally, under the high potential level of the node PD2, transistors M2 and M4 are turned on. Thus, the potential levels of the output port OUTPUT and the pull-up node PU can be pulled down.

Referring to FIG. 7, in the second discharge maintaining period, the second clock signal is provided with a logic high potential. Transistors M5, M7, and M9 are turned on, similar to the situation in the discharge pull-down period shown in FIG. 5. Thus, the first pull-down node PD1 can be set to a logic high potential which turns transistors M10 and M11 on to pull down the potential levels of the output port OUTPUT and the pull-up node PU. Additionally, the second pull-down node PD2 is in float state (previously at a logic high potential) and can turn transistors M2 and M4 on. The conduction state of both M2 and M4 can pull down the potential levels of the output port OUTPUT and the pull-up node PU.

In some embodiments as shown in FIG. 3 through 7, the first clock signal at port CLK and the second clock signal at port CLKB are alternatively provided with a logic high level and a logic low level with a substantially same frequency and amplitude but in reversed phase. Specifically, in any period of the display cycle, when the first clock signal is provided with a logic high potential, the second clock signal is just provided with a logic low potential. Conversely, when the first clock signal is provided with a logic low potential, the second clock signal is just provided with a logic high potential.

In some embodiments, when the pull-up node PU is set to logic low potential as the first discharge maintaining period shown in FIG. 6, the pull-down control sub-circuit 103 is configured to control the potential level of the second pull-down node PD2 at logic high under the control of the first clock signal being provided at a logic high potential. When the pull-up node PU is set to logic low potential as the discharge pull-down period shown in FIG. 5 and the second discharge maintaining period shown in FIG. 7, the pull-down control sub-circuit 103 is also configured to control the potential level of the first pull-down node PD1 at logic high under the control of the second clock signal being provided at a logic high potential. Therefore, the pull-down control sub-circuit 103 can always control the potential levels of either the first pull-down node PD1 or the second pull-down node PD2 at logic high during the period that the pull-up node PU is set to a logic low potential. As shown in the second discharge maintaining period (FIG. 7), the pull-down control sub-circuit 103 can also control the second pull-down node PD2 to the logic high potential.

Accordingly, in response to the logic high potential being set to at least one of the first pull-down node and the second pull-down node when the pull-up node is at the logic low potential, the pull-down sub-circuit 104 can be operated to pull down the potential levels of the output port OUTPUT and the pull-up node PU. Therefore, in the shift register unit 10 disclosed in this specification, the noise at the output port and the pull-up node induced by the parasitic capacitance of the transistors in the pull-up sub-circuit 102 can be suppressed. As the shift register unit 10 is used in a display apparatus for control image display, the problems of light leakage or image strobe or blur caused by the noise are substantially eliminated.

In some embodiments, the shift register unit circuit also includes the reset sub-circuit 105 for receiving a reset signal from the RESET port. The reset signal can be used by the pull-down sub-circuit 104 to control the potential level of the second pull-down node PD2. As shown in FIG. 2, the reset sub-circuit 105 includes a diode D2 having its anode connected to the reset port RESET and its cathode connected to the second pull-down node PD2. When the reset signal received by the RESET port is a logic high potential signal, this reset signal can pass the diode D2 so as to make the potential level of the second pull-down node PD2 at logic high. As a result, the pull-down sub-circuit 104, through transistors M2 and M4, can respond to the logic high potential of the second pull-down node PD2 to pull down the potential levels of the output port OUTPUT and the pull-up node PU.

In an embodiment, as shown in FIG. 5, the reset signal optionally is actually an output signal of a shift register unit in a next adjacent stage. During the discharge pull-down period, the high potential level of the reset signal can make the potential level of the second pull-down node PD2 at logic high. Therefore, the pull-down sub-circuit 104 can also pull down the potential levels of the output port OUTPUT and the pull-up node PU. In another embodiment, as shown in FIG. 6 and FIG. 7, because of the high potential level at the second pull-down node PD2 controlled by the reset signal, the reset sub-circuit 105 can prevent (through the diode D2) noise interference to the reset signal as well as the output signal of the shift register unit in the next adjacent stage. Similarly, as shown in FIG. 5, because of the high potential level at the second pull-down node PD2 controlled by the reset signal, the pull-down control sub-circuit 103 can prevent (through the diode D1) noise interference to the first clock input port.

In some embodiments, the shift register unit circuit provided in the present disclosure further includes an initialization sub-circuit 106 connected to an initialization port STV0 for receiving an enabling signal to control pulling down the potential level of the second pull-down node PD2. As shown in FIG. 2, the initialization sub-circuit 106 includes a transistor M12. M12 has a gate connected to the initialization port STV0, a drain connected to the second pull-down node PD2, and a source connected to the low potential terminal VSS. In a specific embodiment, referring to FIG. 2, the initialization sub-circuit 106 is configured to receive a logic high potential signal from the initialization part STV0 before the shift register unit starts normal operation in a plurality of display cycles (including the charging period, the pull-up period, the pull-down period, the first and second maintaining period) to make transistor M12 to a conduction state. This provides the shift register unit with a capability to pull down the second pull-down node PD2 to discharge for achieving a stable operation condition for the shift register unit itself.

In the descriptions above and throughout the specification and in the illustration of timing diagrams shown in part (B) of FIGS. 3-7, the setting of logic low or high potentials for corresponding control signals like Input, CLK, CLKB, Reset, etc. are selected based on the usage of N-type transistors in the shift register unit circuit. If P-type transistors are used, the potential level can be re-adjusted accordingly. Similarly, the low potential terminal VSS may also be replaced by a high potential terminal.

Figure 8:
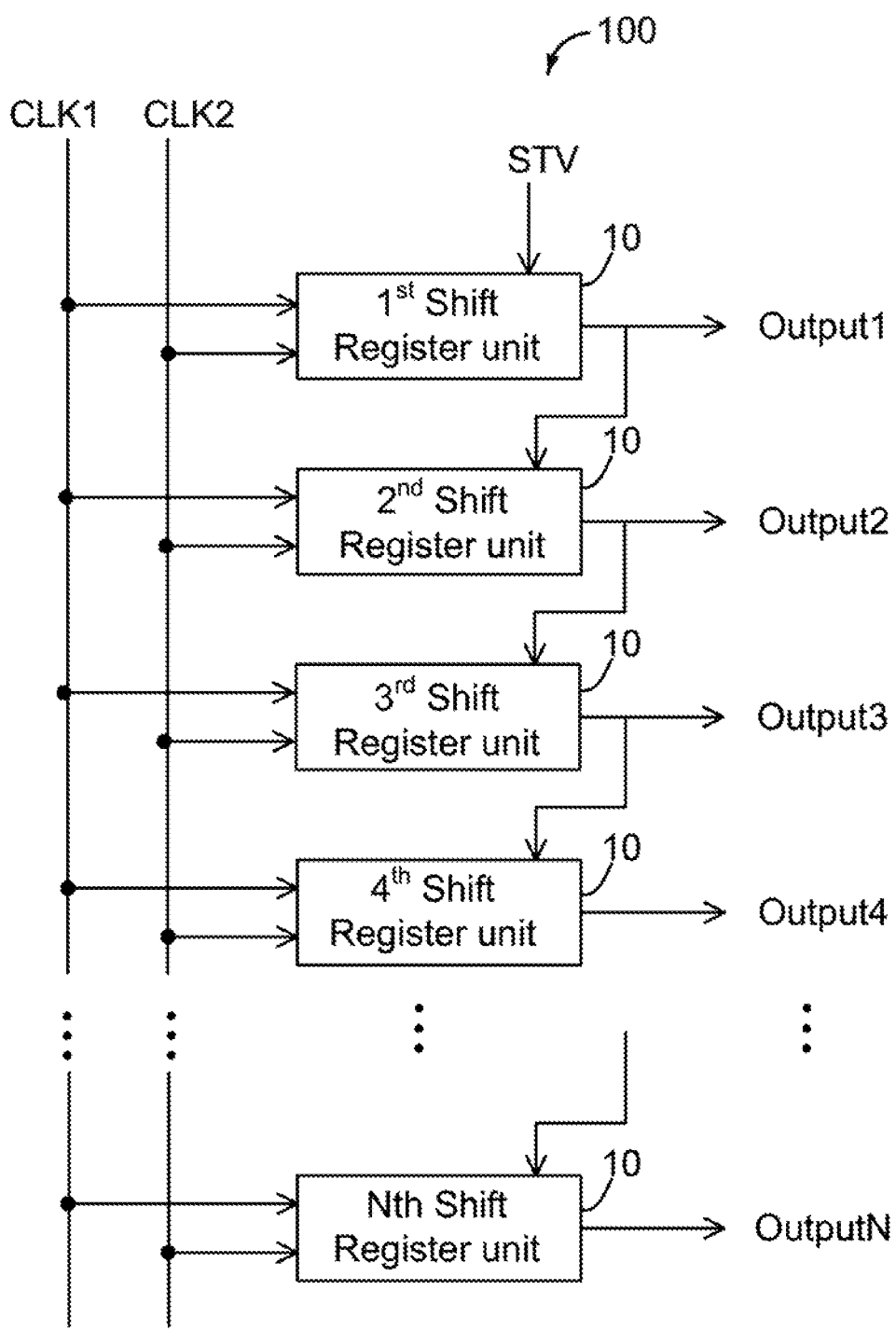
FIG. 8 is a functional diagram of a gate drive circuit including multiple cascaded shift register units according to some embodiments.

Accordingly, the present invention provides, inter alia, a gate drive circuit, a display panel and a display apparatus having the same, and a method for driving the shift register unit that substantially obviate one or more of the problems due to limitations and disadvantages of the related art. In one aspect, the present invention provides a gate dive circuit as shown in FIG. 8. As shown, total N numbers of shift register units 10 are cascaded in an N-stage series to form the gate drive circuit 100, where N is a natural integer greater than 1. In particular, any shift register unit in n-th stage has an input port being configured to connect with an output port, Output(n), of the shift register unit in previous adjacent (n−1)-th stage. Here, 1<n≤N. In other words, the output signal of the (n−1)-th stage unit is used as an input signal of the n-th stage unit. The input port INPUT of the first stage unit receives an enabling signal STV. Each stage of the shift register units shares a first clock signal received from a first clock terminal CLK1 and a second clock signal received from a second clock terminal CLK2. The first clock signal and the second clock signal are alternatively changed between a logic low and a logic high potential with a reversed phase. Additionally, the initialization sub-circuit of each shift register unit is also configured to have an initialization port STV0 receiving the enabling signal STV. The gate drive circuit 100 thus is configured to generate a gate driving signal sequentially shifted from the enabling signal STV based on the corresponding first clock signal and second clock signal and outputted from the output port, from Output1 through OutputN, of every shift register unit 10.

Figure 9:
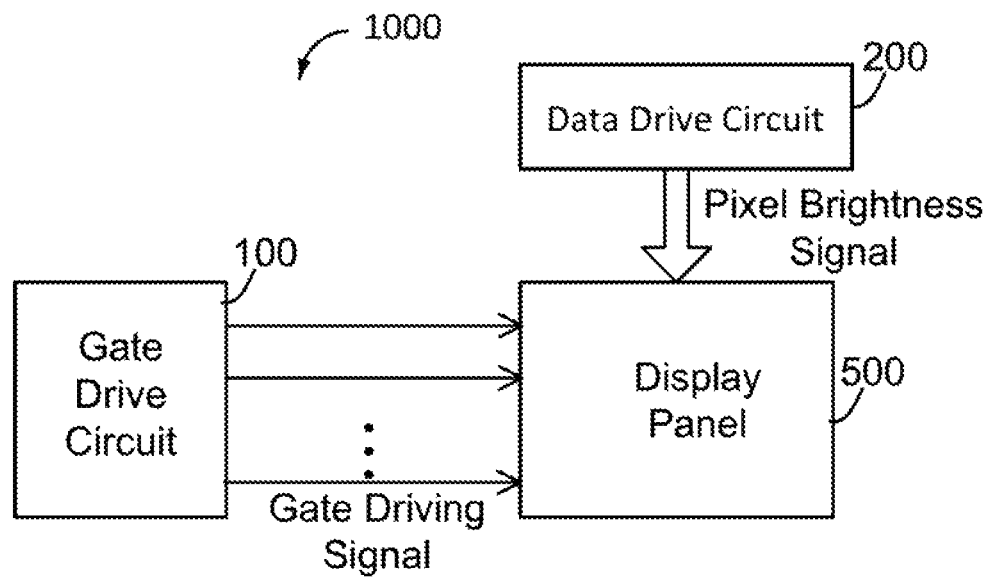
FIG. 9 is a functional diagram of a display apparatus including the gate drive circuit according to some embodiments.

In an alternative aspect, the present invention provides a display apparatus including the gate drive circuit. FIG. 9 is a functional diagram of a display apparatus including the gate drive circuit according to some embodiments. As shown, the display apparatus 1000 includes a display panel 500 coupled to the gate drive circuit 100 and a data drive circuit 200. The gate drive circuit 100 is substantially the same one shown in FIG. 8 including a plurality of shift register units 10 respectively coupled to a plurality of rows of thin-film transistors in the pixel region of the display panel 500. Each shift register unit is configured to have its output port OUTPUT connected to a gate line commonly shared by a row of thin-film transistors so that a corresponding gate driving signal can be applied to a gate of each transistor for controlling pixel brightness signals sent from the data drive circuit 200 to the pixel region. Specifically, when the output signal from the shift register unit is a logic high potential, the corresponding row of transistors are turn on to a conduction state to allow respective data signals to pass from the data drive circuit 200 to corresponding light emission elements. Since the cascaded shift register units are configured to sequentially output a shifted gate driving signal one after another, the thin-film transistors on the display panel 500 are also sequentially turned on one row after another. Thus, the turned-on transistors are able to control pixel brightness in corresponding rows based on the received/passed data signals associated with predetermined brightness level of certain color (red, green, and blue) sub-pixels. With desired pixel brightness level being set to be associated with the data signals passed to the corresponding light emitting elements in the pixel region of the display panel 500, various colored light with brightness level set by the data signals can be generated to produce an image on the display panel 500.

Figure 10:
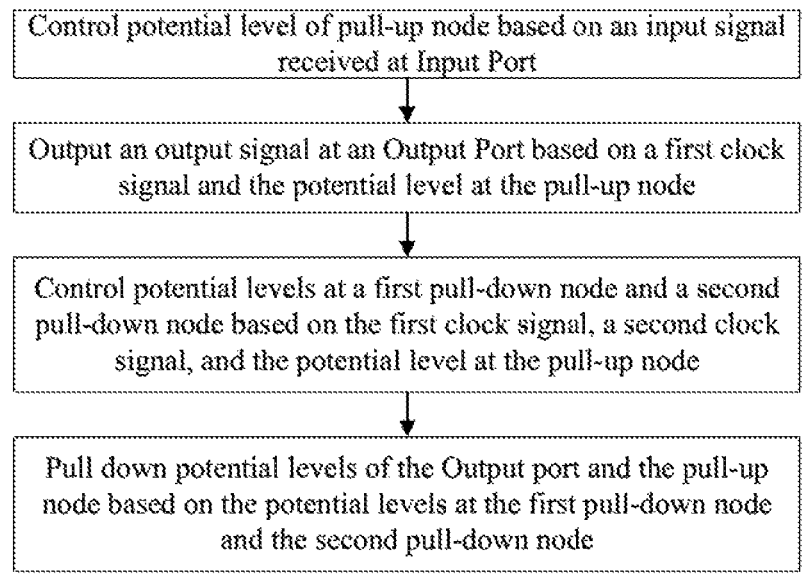
FIG. 10 is a flow chart showing a method for driving the shift register unit according to some embodiments.

In another alternative aspect, the present invention provides a method for driving the shift register unit disclosed in this specification. FIG. 10 is a flow chart showing a method for driving the shift register unit according to some embodiments. The shift register unit used here is substantially the same as the shift register unit 10 in FIG. 1 and FIG. 2. As shown, the method includes controlling a potential level of a pull-up node based on an input signal received at an input port of the shift register unit. Specifically, as shown in FIG. 1, the pull-up control sub-circuit 101 controls the potential level of the pull-up node PU based on the input signal received at the input port. For example, when the input signal is a logic high potential, the pull-up node PU is set to the logic high potential. As shown in FIG. 2, the pull-up control sub-circuit 101 includes a transistor M1. When the input signal received from INPUT is at logic high potential, the transistor M1 is turned on to set the pull-up node PU to the logic high potential. Conversely, when the input signal received at INPUT is a logic low potential, M1 is in a block state and cannot pass the input signal to the pull-up node PU.

In another example as shown in the part (B) of FIG. 3, during a buffer charging period of an image display cycle, the input signal at INPUT is logic high potential and M1 thus is turned on, making the potential, level of the pull-up node to the logic high potential. Additionally, the first clock signal is going to be set with a logic high potential provided at a first clock input port CLK during a period that is next to the current buffer charging period with the input signal being at the logic high potential. As shown in FIG. 3, the potential level of the pull-up node PU is at logic high during the charging period so that the capacitor C1 in the pull-up sub-circuit is charged to the high potential and makes transistor M3 to a conduction state. Since the first clock signal provided at the first clock input port CLK is logic low potential, the output port OUTPUT will only output a signal also at logic low potential.

Referring to FIG. 10, the method further includes outputting an output signal at an Output Port based on a first clock signal and the potential level at the pull-up node. Specifically, as shown in FIG. 1, the pull-up sub-circuit 102 control the output signal at the OUTPUT port based on the first clock signal and the potential level of the pull-up node PU. For example, when the pull-up node PU is at high potential and the first clock signal is at high potential, the output port OUTPUT will output a signal also at the logic high potential. As shown in FIG. 2, the pull-up sub-circuit 102 includes a transistor M3 and a capacitor C1. During the pull-up period shown in part (B) of FIG. 4, the first clock signal provided at the first clock input port CLK now is changed to logic high potential and input signal at INPUT becomes a logic low potential. Although the transistor M1 is blocked due to the low potential of the input signal, the potential level at the pull-up node PU can be pushed to a higher level by bootstrapping effect of the capacitor C1, making the transistor M3 still a conduction state. Thus, the output port OUTPUT can pass the first clock signal from port CLK as an output signal which is at a logic high potential.

As seen above, the method for driving the shift register unit leads to outputting an output signal that is shifted relative to the input signal in terms of potential level. Furthermore, the method for driving the shift register unit includes controlling potential levels at a first pull-down node and a second pull-down node based on the first clock signal, a second clock signal, and the potential level at the pull-up node. Specifically, as shown in FIG. 1, the pull-down control sub-circuit 103 controls the potential levels of the first pull-down node PD1 and the second, pull-down node PD2 based on the first clock signal provided at the first clock input port CLK, the second clock signal provided at the second clock input port CLKB, and the potential level of the pull-up node PU. Referring to FIG. 2, the pull-down control sub-circuit 103 includes transistors M5, M9, M6, M8, and optionally M7 as well as a diode D1.

As shown in FIGS. 5-7, when the pull-up node PU is at a logic low potential, in order to prevent the pull-up node PU and the output port OUTPUT from being interfered by noises induced by parasitic capacitance of transistors in the pull-up sub-circuit, the pull-down sub-circuit 104 is used to pull down the potential levels of the pull-up node PU and the output port OUTPUT. Specifically, when the pull-up node potential is at logic low, the method is to control the potential level of either the first pull-down node or the second pull-down node to logic high. Therefore, the pull-down sub-circuit can effectively pull down the potential levels of the pull-up node PU and the output port OUTPUT. Especially, even when the second clock signal provided at the second clock input port CLKB is a logic low potential (see FIG. 6), the shift register unit circuit can allow the logic high potential provided to the first clock signal from port CLK sequentially through the transistor M7 and the diode D1 to maintain the logic high potential level at the second pull-down node PD2. Then, the pull-down sub-circuit 104 can pull down the pull-up node PU and the output port OUTPUT based on the logic high potential at the second pull-down node PD2. In an alternative embodiment, the pull-down control sub-circuit 103 also is configured to control the potential level of the second pull-down node to logic high during the second discharge maintaining period.

Moreover, the method for driving the shift register unit includes pulling down potential levels of the output port and the pull-up node based on the potential levels at the first pull-down node and the second pull-down node. Specifically, as shown in FIG. 1, the pull-down sub-circuit 104 is configured to pull down potential levels of the output port OUTPUT and the pull-up node PU based on the potential levels of the first pull-down node and the second pull-down node. For example, the pull-down sub-circuit 104 pulls down the potentials of the output port OUTPUT and the pull-up node PU to logic low when the first pull-down node or the second pull-down node is set to a logic high potential. As shown in FIG. 2, the pull-down sub-circuit 104 includes transistors M2, M4, M10, and M11. During the discharge pull-down period shown in FIG. 5, the second clock signal provided at the second clock input port CLKB is a logic high potential, turning M5 and M9 on. Because the potential level of the pull-up node is at logic low, turning M6 and M8 off. This makes the first pull-down node PD1 at logic high potential. Thus, transistors M10 and M11 are turned on to conduction states to allow pulling down of the potential levels of the output port OUTPUT and the pull-up node PU by the pull-down sub-circuit 104.

During the first discharge maintaining period shown in FIG. 6, the second clock signal provided at the second clock input port CLKB is at logic high, similarly turning transistors M5, M7, and M9 on. This makes the potential level of the first pull-down node PD1 at logic high and further turns transistors M10 and M11 on. Thus, the pull-down sub-circuit 104 is able to pull down the potential levels of the output port OUTPUT and the pull-up node PU. Regarding the second pull-down node PD2, it is in a float state (at logic high potential set in the previous period) in the first discharge maintaining period so that transistors M2 and M4 are turned on. Again, conduction state of M2 and M4 allows the potential levels of the output port OUTPUT and the pull-up node PU being pulp down.

Under a condition that the pull-up node is at a logic low potential, as shown in the first discharge maintaining period of FIG. 6, the shift register unit uses the pull-down control sub-circuit 103 to control the second pull-down node PD2 at a logic high potential with the first clock signal being provided at logic high potential level. Additionally, as shown in the discharge pull-down period of FIG. 5 and the second discharge maintaining period of FIG. 7, the shift register unit uses the pull-down control sub-circuit 103 to control the first pull-down node potential at logic high. In other words, the pull-down control sub-circuit can always pull down the potential levels of the output port OUTPUT and the pull-up node PU during any period that the potential level of the pull-up node PU is at logic low. Furthermore, during the second discharge maintaining period of FIG. 7, the shift register unit also uses the pull-down control sub-circuit 103 to control the second pull-down node to a logic high potential. Therefore, the pull-down sub-circuit 104 is able to pull down the potential levels of the output port OUTPUT and the pull-up node PU in response to the logic high potential set for at least one of the first pull-down node and the second pull-down node under the condition that the pull-up node potential is at logic low.

Therefore, the method for driving the shift register unit based on the circuit shown in FIG. 2 can, except that the pull-up node is at logic high potential, effectively pull down the potential levels of the output port OUTPUT and the pull-up node PU. Accordingly, the noises on the output port and the pull-up node induced by the parasitic capacitance of the transistors in the pull-down sub-circuit are substantially suppressed. As a result, the images displayed by the display apparatus that contains the shift register unit will no longer have the light leakage, pixel strobe or blur quality problems caused by the noises in every output port of the shift register unit connecting to a corresponding gate line.

Optionally, the method for driving the shift register unit further includes controlling the potential level of the second pull-down node based on a reset signal received at a reset port RESET of the shift register unit circuit. Specifically, the shift register unit circuit includes a reset sub-circuit including at least a diode D2. The diode D2 has an anode connected to the reset port RESET and a cathode connected to the second pull-down node PD2. For example, under a condition that the reset signal is provided with a logic high potential, the reset signal can make, via the diode D2, the potential level of the second pull-down node PD2 at logic high. During the first discharge maintaining period of FIG. 6 and the second discharge maintaining period of FIG. 7, the potential level of the second pull-down node PD2 is set to logic high. If the reset signal of a current-stage shift register unit is an output signal from a next-adjacent-stage of shift register unit, the current-stage shift register unit can use this reset sub-circuit (particularly the diode D2) to prevent noise interference to the reset port and specifically prevent noise interference to the output signal from the next-adjacent-stage shift register unit.

Optionally, the method for driving the shift register unit further includes pulling down the potential level of the second pull-down node based on an enabling signal received from an initialization port STV0. Specifically, the shift register unit circuit includes an initialization sub-circuit including a transistor M12 having a gate connected to the initialization port STV0 and a drain connected to the second pull-down node PD2 and a source connected to the low potential terminal VSS. The method is implemented before operating the shift register unit in a display cycle to receive an enabling signal at logic high potential from the initialization port STV0. This enabling signal turns on the transistor M12 to pull down potential level of the second pull-down node PD2 to the same low potential level set by the low potential terminal VSS. Pulling down the potential level of the second pull-down node PD2 can facilitate discharging of the second pull-down node PD2 to ensure the operation of the shift register unit more stable.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A shift register unit circuit comprising an input port for receiving an input signal, an output port for outputting a gate driving signal, a first clock input port for receiving a first clock signal, a second clock input port for receiving a second clock signal, a pull-up node, a first pull-down node, and a second pull-down node;

the shift register unit circuit further comprising:
a pull-up control sub-circuit connected to the input port and the pull-up node, the pull-up control sub-circuit being configured to control a potential level at the pull-up node based on the input signal received from the input port;
a pull-up sub-circuit connected to the first clock input port and the pull-up node, the pull-up sub-circuit being configured to output an output signal from the output port based on the first clock signal and the potential level at the pull-up node, the output signal being used as the gate driving signal;
a pull-down control sub-circuit connected to the first clock input port, the second clock input port, and the pull-up node, the pull-down control sub-circuit being configured to control potential levels respectively at the first pull-down node and the second pull-down node based on the first clock signal, the second clock signal, and the potential level at the pull-up node;
a pull-down sub-circuit connected to the first pull-down node and the second pull-down node, the pull-down sub-circuit being configured to pull down respective potential levels at the output port and the pull-up node based on the potential levels of the first pull-down node and the second pull-down node;
a reset sub-circuit connected to a reset port for receiving a reset signal to control the potential level at the second pull-down node; and
an initialization sub-circuit configured to receive an enabling signal for pulling-down the potential level at the second pull-down node to a potential level of a fixed low potential terminal;
wherein the pull-down control sub-circuit is configured to maintain the potential levels of the first pull-down node and the second pull-down node at logic low when the potential level of the pull-up node is set to logic high.

2. The shift register unit circuit of claim 1, wherein the reset sub-circuit includes a diode having an anode connected to the reset port and a cathode connected to the second pull-down node.

3. The shift register unit circuit of claim 1, wherein the initialization sub-circuit includes a transistor having a gate receiving the enabling signal, a first terminal connected to the second pull-down node and a second terminal connected to the fixed low potential terminal.

4. The shift register unit circuit of claim 1, wherein the first clock signal and the second clock signal are alternatively provided with a logic high potential and a logic low potential with a substantially same frequency and amplitude but in reversed phase.

5. The shift register unit circuit of claim 4, wherein the pull-down control sub-circuit is configured, under a condition that the potential level of the pull-up node is set at logic high, to maintain the potential level of the second pull-down node at logic low whenever the first clock signal is provided with a logic low potential.

6. The shift register unit circuit of claim 4, wherein the pull-down control sub-circuit is configured, under a condition that the potential level of the pull-up node is set at logic high, to maintain the potential level of the first pull-down node at logic low whenever the second clock signal is provided with a logic low potential.

7. The shift register unit circuit of claim 4, wherein the pull-down control sub-circuit comprises a first transistor, a second transistor, a third transistor, and a fourth transistor; wherein the first transistor has a first terminal connected to the second clock input port and a second terminal connected to the first pull-down node; wherein the second transistor has a first terminal and a control terminal commonly connected to the second clock input port and a second terminal connected to a control terminal of the first transistor; wherein the third transistor has a first terminal connected to the first pull-down node and a control terminal connected to the pull-up node; wherein the fourth transistor has a first terminal connected to the second terminal of the second transistor, a control terminal connected to the pull-up node.

8. The shift register unit circuit of claim 7, wherein the pull-down control sub-circuit further comprising a fifth transistor and a diode, the fifth transistor having a first terminal connected to the first clock input port, a control terminal connected to the second terminal of the second transistor, the diode having an anode connected to a second terminal of the fifth transistor and a cathode connected to the second pull-down node.

9. The shift register unit circuit of claim 8, wherein the pull-down sub-circuit further comprising a sixth transistor, a seventh transistor, an eighth transistor, and a ninth transistor; wherein the sixth transistor has a gate connected to the second pull-down node and a drain connected to the pull-up node; wherein the seventh transistor has a gate connected to the second pull-down node and a drain connected to the output port; wherein the eighth transistor has a gate connected to the first pull-down node and a drain connected to the pull-up node; wherein the ninth transistor has a gate connected to the first pull-down node and a drain connected to the output port.

10. The shift register unit circuit of claim 7, wherein the logic high potential corresponds to a voltage signal that is applied to a gate of any transistor in claim 7 for turning the transistor in a conduction state, the logic low potential corresponds to a voltage signal that is applied to a gate of any transistor in claim 7 for turning the transistor in a blocking-state.

11. A gate drive circuit comprising N numbers of shift register units of claim 1 cascaded in series from a first shift register unit to a N-th shift register unit, N being a natural integer greater than 1, wherein an n-th shift register unit, except the first shift register unit, is configured to have an input port connected to an output port of a previous adjacent (n−1)-th shift register unit, n being a natural integer and 1<n≤N; wherein the first shift register unit has an input port connected to an initialization receiving an enabling signal.

12. A display apparatus comprising a display panel, a data drive circuit, and a gate drive circuit of claim 11 configured to output a plurality of gate drive signals to control a plurality of rows of transistors associated with an array of pixels disposed on the display panel for displaying image based on respective a plurality of image data provided by the data drive circuit.

13. A method for driving the shift register unit circuit, wherein the shift register unit comprises:
a pull-up control sub-circuit connected to an input port and a pull-up node;
a pull-up sub-circuit connected to a first clock input port and the pull-up node for controlling an output port to output an output signal;
a pull-down control sub-circuit connected to a first clock input port, a second clock input port, and the pull-up node;
a pull-down sub-circuit connected to a first pull-down node and a second pull-down node;
a reset sub-circuit connected to a reset port and the second pull-down node; and
an initialization sub-circuit connected to an initialization port and the second pull-down node and a low potential level terminal;
the method comprising:
controlling a potential level of the pull-up node via the pull-up control sub-circuit based on an input signal received at the input port;
outputting an output signal from the output port controlled by the pull-up sub-circuit based on a first clock signal provided at the first clock input port and the potential level of the pull-up node;
controlling potential levels of the first pull-down node and the second pull-down node via the pull-down control sub-circuit based on the first clock signal, a second clock signal provided at the second clock input port, and the potential level of the pull-up node;
pulling down potential levels of the output port and the pull-up node controlled by the pull-down sub-circuit based on the potential level of the first pull-down node and/or the potential level of the second pull-down node;
wherein controlling potential levels of the first pull-down node and the second pull-down node comprises maintaining the potential level of the first pull-down node or the second pull-down node to be logic high when the potential level of the pull-up node is at logic low.

14. The method of claim 13, further comprising controlling a potential level of the second pull-down node to logic high based on a reset signal received at the reset port by the reset sub-circuit via a diode.

15. The method of claim 13, further comprising pulling down the potential level of the second pull-down node to logic low based on an enabling signal at logic high received from the initialization port connected to the initialization sub-circuit through a gate of a transistor, the transistor having a source connected to the second pull-down node and a drain connected to a fixed low potential terminal.

16. The method of claim 13, wherein the first clock signal and the second clock signal are alternatively provided with a logic high potential and a logic low potential with a substantially same frequency and amplitude but in reversed phase.

17. The method of claim 16, wherein controlling potential levels of the first pull-down node and the second pull-down node comprises, under a condition that the potential level of the pull-up node is set at logic high, maintaining the potential level of the second pull-down node at logic low whenever the first clock signal is provided with a logic low potential.

18. The method of claim 16, wherein controlling potential levels of the first pull-down node and the second pull-down node comprises, under a condition that the potential level of the pull-up node is set at logic high, maintaining the potential level of the first pull-down node at logic low whenever the second clock signal is provided with a logic low potential.

* * * * *